United States Patent [19]

Sugita

[11] Patent Number: 4,910,549

[45] Date of Patent: Mar. 20, 1990

[54] EXPOSURE METHOD AND APPARATUS THEREFOR

[75] Inventor: Mamoru Sugita, Kumamoto, Japan

[73] Assignees: Tokyo Electron Limited, Tokyo; Tel Kyushu Limited, Kumamoto, both of Japan

[21] Appl. No.: 236,848

[22] Filed: Aug. 26, 1988

[30] Foreign Application Priority Data

Aug. 28, 1987 [JP] Japan .................................. 62-216009

[51] Int. Cl.4 ............................................ G03B 27/42
[52] U.S. Cl. ......................................... 355/53; 355/72
[58] Field of Search ............................... 355/50, 53, 72

[56] References Cited

U.S. PATENT DOCUMENTS 4,089,605  5/1978  Spence-Bate ........................ 355/53
4,603,968  8/1986  Schmidt ............................... 355/53

FOREIGN PATENT DOCUMENTS

59-158520  9/1984  Japan .
61-73330   4/1986  Japan .
61-142321  6/1987  Japan .

Primary Examiner—Monroe H. Hayes
Attorney, Agent, or Firm—Oblon, Spivak, McClelland, Maier & Neustadt

[57] ABSTRACT

In an exposure method of the present invention, exposure light is radiated onto a peripheral portion of a substrate to be processed while the substrate is rotated, and the rotational speed of the substrate is selectively decreased when a specific peripheral portion reaches an exposure area, thereby performing predetermined exposure of the substrate. An exposure apparatus of the present invention includes a mounting table on which the substrate is mounted, a rotating mechanism for rotating the mounting table at a predetermined rotational speed, a light radiating element arranged to oppose a mounting surface of the mounting table, light amount control means for controlling the amount of light radiated from the light radiating element onto the substrate, and rotational speed control means for controlling the rotational speed of the mounting table in accordance with the radiation amount of light from the light radiating element.

4 Claims, 6 Drawing Sheets

EXPOSURE METHOD AND APPARATUS THEREFOR

BACKGROUND OF THE INVENTION

1. Field of the Invention

The present invention relates to an exposure method and an apparatus therefor.

2. Description of the Related Art

Generally, a lithographic process, which is one of the manufacturing processes of a semiconductor device, can be mainly divided into five steps, i.e., surface treatment, resist coating, exposure, development, and etching. A projection type exposure apparatus used in these steps and a vacuum generator for etching or the like employ mechanical systems for clamping the periphery of wafer to convey a semiconductor wafer or fix it to a treatment table. However, if an after-treatment is insufficient in the resist coating process, a resist may remain on a peripheral portion of a semiconductor wafer. In such a case, when the semiconductor wafer is conveyed, resist peeling tends to occur, and hence contaminants are generated.

As means for preventing generation of such contaminants, Japanese Patent Publication No. 53-37706, Japanese Patent Disclosure (Kokai) Nos. 55-12750, 58-58731, and 58-191434, Japanese Utility Model Disclosure (Kokai) Nos. 60-94660 and 61-111151, and Japanese Patent Disclosure (Kokai) Nos. 61-121333 and 61-184824 disclose a side rinse process, or Japanese Patent Disclosure (Kokai) No. 58-200537, Japanese Utility Model Disclosure (Kokai) Nos. 58-81932 and 59-67930, and Japanese Patent Disclosure (Kokai) Nos. 60-110118, 60-121719, 60-18993, and 61-239625 disclose back side cleaning. According to these means, after resist coating is finished, a solvent is sprayed on a peripheral portion of a wafer, thereby removing resist and the like from the peripheral portion.

The above side rinse process or back side cleaning is performed while a wafer is rotated. For this reason, a treatment such as a side rinse cannot be selectively performed for an orientation flat. For this reason, when a resist n the orientation flat is to be removed, an entire area of resist removal must be increased. Therefore, the number of semiconductor chips which can be simultaneously manufactured is decreased, and hence the product yield is decreased. In addition, the resist left on a boundary portion upon removal of the resist is swollen. For this reason, in an apparatus adopting a system of focusing a plurality of points outside an exposure area, defocus may occur. In order to process an orientation flat and the like in the same manner as a peripheral portion, a method has been developed, wherein a porous member containing a solvent which is disclosed in, e.g., Japanese Patent Disclosure (Kokai) Nos. 59-117123 and 61-219135, is brought into contact with the periphery of a semiconductor wafer. However, these means cannot solve the problems such as defocus.

In addition, Japanese Patent Disclosure (Kokai) Nos. 58-159535 and 61-73330, Japanese Utility Model Disclosure (Kokai) No. 60-94661, and the like disclose a method of using exposure means for removing resist layer on a peripheral portion of a semiconductor wafer in an annular form, as a means of solving the problem of defocus. According this method, however, the problem of resist removal from an orientation flat still remains unsolved.

A cam method may be available for solving the problems of resist removal from an orientation flat and of defocus. According to this method, a wafer is positioned on a chuck having a cam of a shape identical to that of a semiconductor wafer arranged on its rotary shaft, and is chucked thereto. Then, the wafer is rotated while exposure light guided by an optical fiber or the like traces the cam. With this arrangement, a peripheral portion of the wafer is exposed. This method requires a cam having a shape matched with that of a wafer. In addition, cams must be exchanged depending on the type of wafer. This interferes with factory automation (FA). Moreover, contaminants may be generated due to wear of a cam. That is, contaminants other than resists may be generated.

SUMMARY OF THE INVENTION

It is an object of the present invention to provide an exposure method which can expose substrates to be processed with a high yield without being influenced by the shapes of the substrates while preventing generation of contaminants such as resists and preventing defocus.

It is another object of the present invention to provide an exposure apparatus which can expose substrates to be processed with a high yield without being influenced by the shapes of the substrates while preventing generation of contaminants such as resists and preventing defocus.

More specifically, according to the present invention, there is provided an exposure method, comprising the steps of:

continuously rotating a substrate to be processed;

exposing a peripheral portion of the substrate; and selectively delaying a rotational speed of the substrate when a specific part of the peripheral portion reaches an exposure area.

In this case, the substrate to be processed to which the present invention is applied is, for example, a semiconductor wafer having a resist film formed on its surface.

In the step of exposing the substrate, the specific part of the peripheral portion of the substrate may be exposed a plurality of times.

It is preferable that the light amount in the step of exposing the specific part of the peripheral portion of the substrate is larger than that provided to the peripheral portion other than the specific part thereof.

The length of the exposure area is properly set to correspond to a predetermined distance between the end face of the periphery and the center of the substrate. Detection of the end face of the substrate can be performed by using, e.g., a photosensor constituted by a solid-state imaging element. In addition, it is preferable that the width of the exposure area is properly determined by selectively decreasing the rotational speed of the substrate.

Furthermore, according to the present invention, there is provided an exposure apparatus, comprising:

a mounting table on which a substrate to be processed is mounted;

a rotating mechanism for rotating the mounting table at a predetermined rotational speed;

a light radiating element arranged to oppose a mounting surface of the mounting table;

light amount control means for controlling an amount of light radiated from the light radiating element onto the substrate;

a movable mechanism for reciprocating the light radiating element along a straight line extending through a center of the mounting surface; and rotational speed control means for controlling a rotational speed of the mounting table in accordance with a radiation amount of light from the light radiating element.

In this case, the movable mechanism is preferably operated in response to a signal from the end face detecting means for detecting the end face of the substrate.

In addition, a means comprising a photosensor constituted by a solid-state imaging element is preferably used as the end face detecting means.

According to the exposure method and apparatus of the present invention, the rotational speed of a substrate to be processed can be changed, or a light amount itself during exposure of the substrate can be directly changed. With this arrangement, a specific area of a peripheral portion of the substrate can be exposed to light of an arbitrary amount. As a result, the orientation flat of the substrate, which is heteromorphic, can be exposed to light of the same optimal amount as that used for other parts of the peripheral portion. Upon exposure, a resist film on that portion can be reliably removed by, e.g., developing and cleaning the exposed portion. As a result, a local projection of the resist film can be prevented, and so-called defocus can be prevented. Therefore, a clean, fine pattern can be easily formed on a semiconductor wafer or the like.

DETAILED DESCRIPTION OF THE PREFERRED EMBODIMENT

An embodiment wherein an exposure method and an exposure apparatus of the present invention are applied to a side rinse process and back side cleaning in manufacture of semiconductor devices will be described below with reference to the accompanying drawings.

Figure 1A:
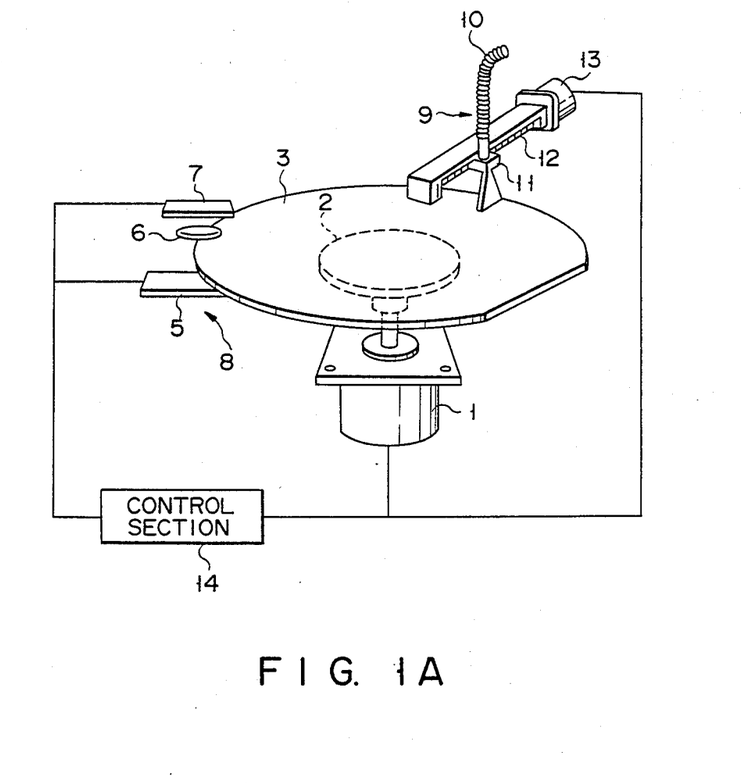
FIG. 1A is a view illustrating an arrangement of an exposure apparatus used for embodying an exposure method according to the present invention.
Figure 2:
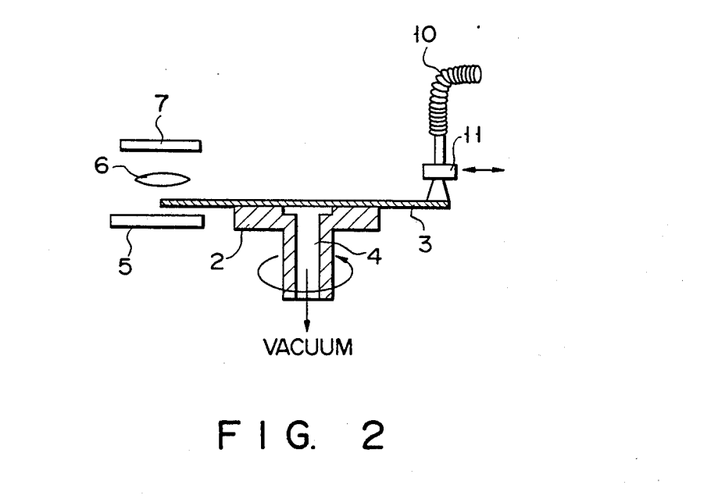
FIG. 2 is a side view showing a main part of the apparatus in FIG. 1.

FIG. 1 is a view illustrating an arrangement of the exposure apparatus used for executing the exposure method of the present invention. Referring to FIG. 1, reference numeral 1 denotes a rotating mechanism of mounting table 2 on which a wafer after a resist spin process is mounted. Rotating mechanism 1 is constituted by, e.g., a stepping motor whose rotational angle can be controlled by pulses. Disk-like mounting table 2 is located above rotating mechanism 1, coupled to its rotary shaft, and airtightly sealed in a case (not shown). As shown in FIG. 2, a substrate to be processed is placed on mounting table 2 and is chucked and fixed by central suction hole 4. The substrate to be processed is, e.g., semiconductor wafer 3 having an orientation flat. End face detecting means 8 is arranged near mounting table 2 to detect a specific peripheral portion of semiconductor wafer 3, which is required in side rinse or back side cleaning.

More specifically, sensor light source 5 is arranged on one surface side (e.g., lower surface side) of semiconductor wafer 3 so as to detect the periphery of semiconductor wafer 3. Sensor light source 5 is constituted by, e.g., a one-dimensionally LED array. Photosensor 7 is arranged on the other surface side of semiconductor wafer 3 through lens 6. Photosensor 7 is constituted by a one-dimensional sensor using a solidstate imaging element, e.g., a CCD (Charge Coupled Device). End face detecting means 8 is constituted by sensor light source 5 and the like.

Figure 1B:
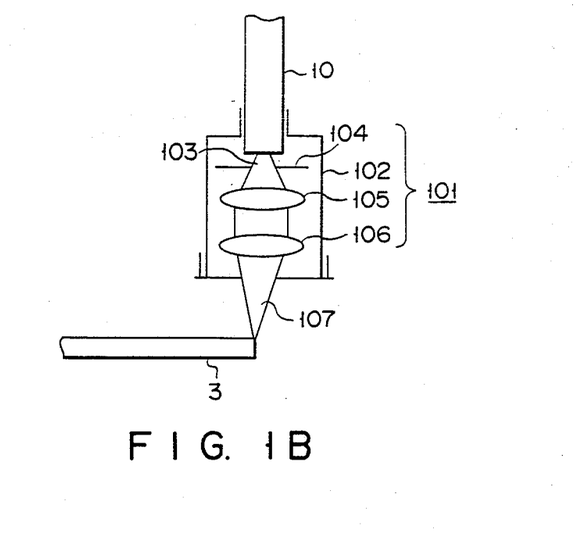
FIG. 1B is a view illustrating an light output portion arranged on the distal end of light guide tube.

Exposure section 9 for a side rinse or back side cleaning treatment is arranged in the following manner. Light radiating element 11 is arranged to oppose the mounting surface of mounting table 2. Light radiating element 11 is guided and reciprocated by movable mechanism 12. Movable mechanism 12 is arranged above mounting table 2 along a straight line extending through the center of rotation of semiconductor wafer 3. Light guide tube 10 consisting of, e.g., optical glass fibers or liquid fibers (a trade mark of ULTRA FINE TECHNOLOGY Inc.) is connected to light radiating element 11. Exposure light such as UV light is guided from a light source (not shown) to light guide tube 10. As shown in FIG. 1B, light output portion 101 is arranged on the distal end of light guide tube 10. More specifically, cylindrical airtight case 102, e.g., a square case, is coupled to the distal end of light guide tube 10. Aperture 104 having square opening 103, e.g., a rectangular opening coaxial with the optical path of tube 10 is arranged in case 102. Optical lenses 105 and 106 are arranged on the transmission optical path of aperture 104 such that light is focused on a surface of semiconductor wafer 3. In order to prevent reflected light upon light radiation onto wafer 3 from being incident on light output portion 101, i.e., to prevent flare, ring skirt 107 is coupled to the distal end of light output portion 101 to constitute light output portion 101. The inner surface of light output portion 101 is preferably a black surface. Movable mechanism 12 comprises, e.g., a ball screw. Drive mechanism 13 is coupled to the ball screw to transmit a rotational torque to movable mechanism 12 through the ball screw. Drive mechanism 13 is driven by a stepping motor which is controlled by pulses. Thus, exposure section 9 is constituted by light radiating element 11 and the like. Note that end face detecting means 8 and exposure section 9 can be arranged at the same position. In this case, the throughput of the apparatus can be increased.

Figure 3:
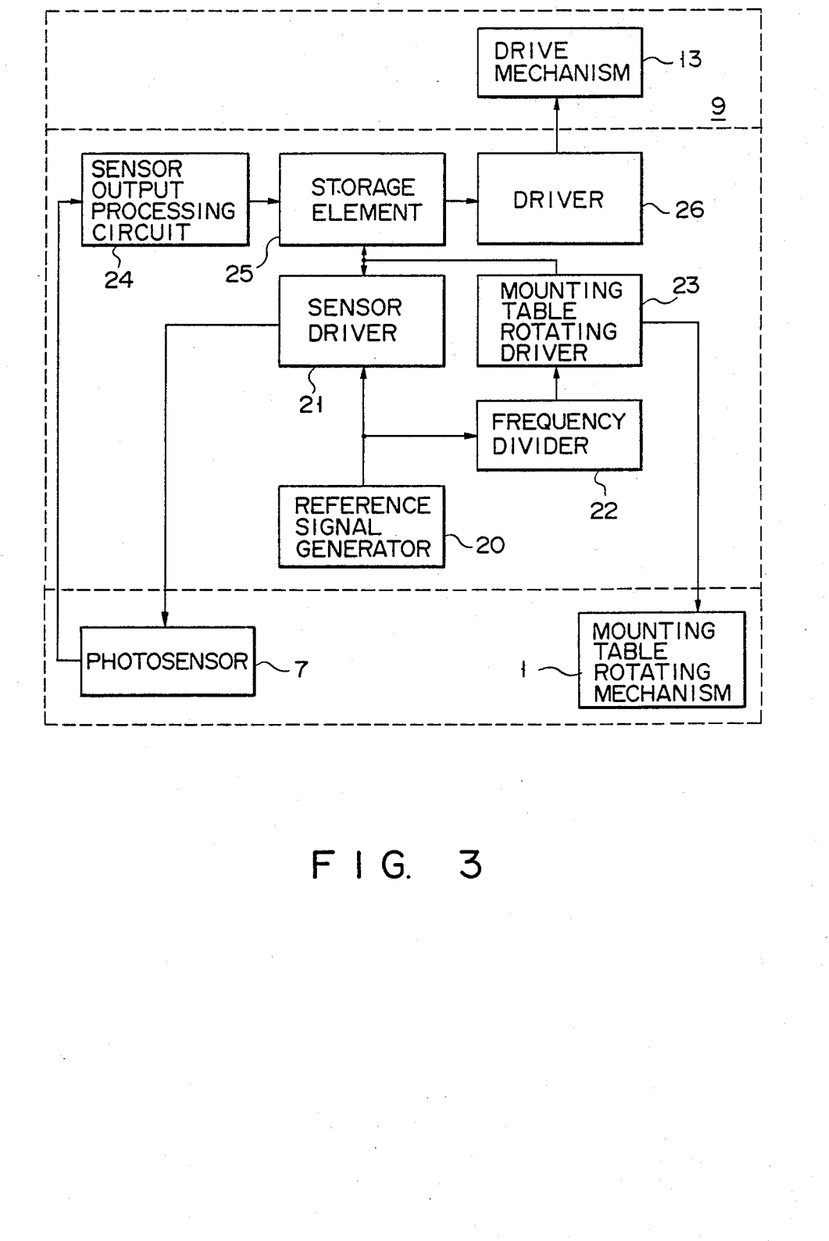
FIG. 3 is a block diagram showing a system of drive control of the apparatus in FIG. 1.

Operations of end face detecting means 8 and exposure section 9 are controlled by control section 14 shown in FIG. 3 upon transmission/reception of predetermined command and detection signals.

A method of exposing a peripheral portion of semiconductor wafer 3 by using such an exposure apparatus will be described below.

Figure 5:
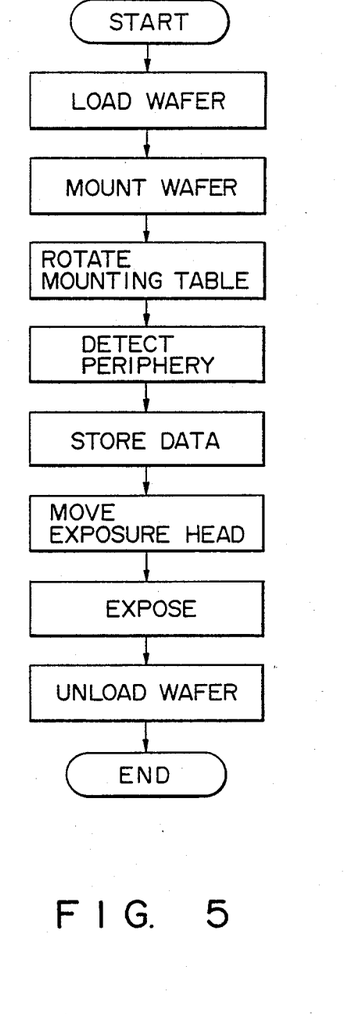
FIG. 5 is a flow chart for explaining an operation of the apparatus in FIG. 1.

FIG. 5 is a flow chart of the steps of the exposure method.

Semiconductor wafer 3 is loaded by a conveying mechanism (not shown), e.g., a handling arm, and is placed on mounting table 2. A surface of semiconductor wafer 3 is coated with, e.g., a resist in the previous process by, e.g., spin coating. Semiconductor wafer 3 is positioned such that its central portion is coaxial with the rotary shaft of mounting table 2. At this time, semiconductor wafer 3 is chucked to mounting table 2 by vacuum air from a vacuum generator or the like through suction hole 4 of mounting table 2.

An exposure process is started by a signal from control section 4 in the following manner.

Mounting table 2 is rotated by rotating mechanism 1 so as to rotate semiconductor wafer 3 at a predetermined rotational speed, e.g., 10 to 60 seconds per revolution. This rotational speed is properly changed depending on a light source. Rotating mechanism 1 of mounting table 2 is driven by, e.g., a stepping motor whose rotational angle is controlled by pulses. Photosensor 7 (e.g., a CCD image sensor) of end face detecting means 8 is scanned in synchronism with each step of the stepping motor. With this operation of end face detecting means 8, the length of a predetermined peripheral exposure portion from the end face of semiconductor wafer 3 is detected.

In this case, photosensor 7 is fixed to a desired position crossing the peripheral portion of semiconductor wafer 3. An output signal from photosensor 7 is obtained as a voltage level difference proportional to the length from the end face of semiconductor wafer 3. Control section 14 calculates the length of the exposure area from the end face to the predetermined position of semiconductor wafer 3 by using the output signal from photosensor 7. In this case, sensor light source 5 serves to increase contrast of the output signal. Therefore, sensor light source 5 may be constituted by a one-dimensionally LED array or a surface light source. In addition, if the sensitivity of sensor 7 is high, sensor light source 5 need not be turned on. Lens 6 serves to increase the detection width of photosensor 7. Therefore, if the size difference between substrates to be processed is not excessively large, lens 6 need not be used. In this case, if a CCD image sensor, which is a solid-state imaging element, is used as photosensor 7, since it has a high sensitivity, even when a light transmission type substrate such as a glass substrate is to be processed, it can detect a very small difference in light amount thereof. The calculated data of the peripheral portion of semiconductor wafer 3 is stored in a storage element (not shown) in control section 14. The process width of the predetermined exposure area requiring side rinse or back side cleaning is calculated by using this stored data. A position irradiated with light by means of exposure section 9 is controlled on the basis of the calculation result. More specifically, light is guided from a light source (not shown) to light radiating element 11 through light guide tube 10. Light from a mercury, xenon, or ultraviolet lamp is used as exposure light from the light source. An irradiated position is determined on the basis of the data stored in the storage element. That is, a signal obtained by calculating a desired portion on semiconductor wafer 3, which is exposed for side rinse or back side cleaning, is supplied from the storage element to control section 14. Control 14 controls the operations of movable and drive mechanisms 12 and 13 by using this signal. Exposure of a predetermined area is performed in this manner on the basis of relative driving of semiconductor wafer 3, which is the substrate to be process, and light radiating element 11. For example, semiconductor wafer 3 is successively exposed every step of the stepping motor while it is rotated about its rotational axis is fixed on mounting table 2. With this operation, the orientation flat of semiconductor wafer 3 can be processed in the same manner as other parts of the peripheral portion while the predetermined exposure area is secured. FIGS. 1C, 1D, 1E, and 1F show radiation states of peripheral exposure at this time.

More specifically, UV light from light guide tube 10 is formed into light beam 107 having a shape identical to that of rectangular opening 103 of aperture 104, is focused by optical lenses 105 and 106, and then radiated onto an area of semiconductor wafer 3 automatically set by the above-described means.

The state of the enlarged peripheral portion of semiconductor wafer 3 at this time will be described with reference to the drawings. An irradiation light pattern output from light output portion 101 to semiconductor wafer 3 has a shape identical to that of opening 103 of aperture 104, i.e., a rectangular shape shown in FIG. 1E.

As a practical example of radiation, a method of irradiating only an edge portion of the wafer with light may be considered. However, in consideration of various adjusting means, it is preferable in practice that an illumination position is set so that the illumination light pattern crosses a central portion of the peripheral portion, as shown in FIGS. 1D, 1E, and 1F. In addition, the shape of the focused light beam may be a rectangular shape as shown in FIG. 1E. However, when the fact that illuminances at the fur corners are lowered is taken into consideration, a shape without corners is preferable.

Furthermore, the shape of the light beam may be changed into various shapes such as an elliptical spot as long as it is substantially square. By changing the shape of a light beam in this manner, uniform peripheral exposure can be realized.

Figure 1C:
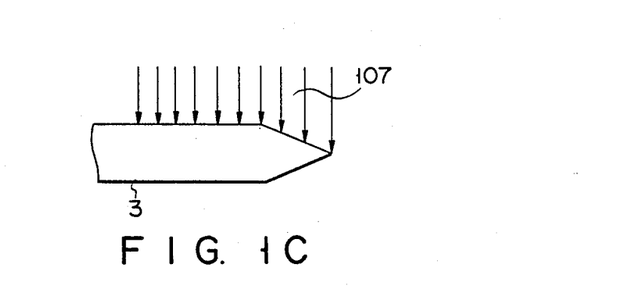
FIG. 1C to FIG. 1F are views illustrating radiation states of peripheral exposure.
Figure 1D:
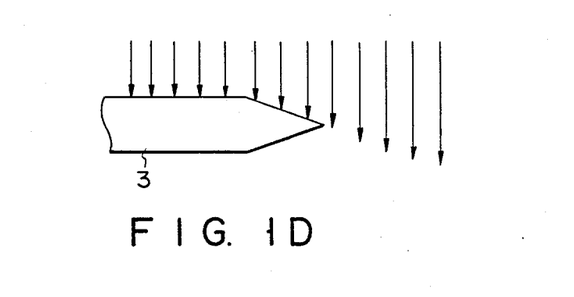
Figure 1E:
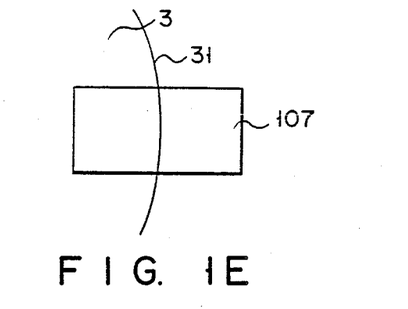
Figure 1F:
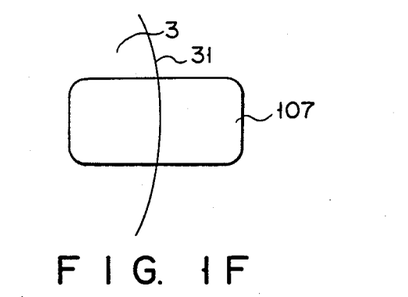

Note that in FIGS. 1C and 1D, edge portions are protruded in the forms of rectangles so as to show exaggerated peripheral sectional areas of actual wafers.

When desired exposure is finished, semiconductor wafer 3 is unloaded by the conveying mechanism (not shown), thereby completing the exposure process. Unloaded semiconductor wafer 3 is processed by a process apparatus (not shown) in the next process, wherein the resist on the exposed peripheral portion is developed and cleaned. After such process, an exposure process of a semiconductor pattern is performed. In the embodiment, the residual resist is removed in the above process. With this process, the problem of defocus due to a resist projection on a boundary portion formed upon removal of resist and the like can be solved.

In the above embodiment, photosensor 7, rotating mechanism 13, and drive mechanism 13 are controlled by control section 14. Mounting table rotating driver 23 is designed in accordance with a control block shown in FIG. 3. More specifically, a predetermined clock is generated by reference signal generator 20. A drive pulse is generated by sensor driver 21 on the basis of the clock signal. A drive pulse for rotating mechanism 1 is generated by mounting table rotating driver 23 on the basis of a pulse frequency-divided by frequency divider 22. Then, the drive pulse controls scanning of photosensor 7. Sensor output processing circuit 24 compares an output signal level with a predetermined threshold value at each timing when a pulse is supplied to photosensor 7 for scanning. Then, detection of a peripheral portion of semiconductor wafer 3 is performed on the basis of a position detected by photosensor 7. Resultant data of the peripheral portion is written in storage element 25. When this peripheral portion of semiconductor wafer 3 reaches a position where light radiating element 11 is located, light radiating element 11 for exposure is moved by driver 26 and drive mechanism 13 in accordance with the data in storage element 25, thereby exposing the peripheral portion of semiconductor wafer 3.

Figure 4:
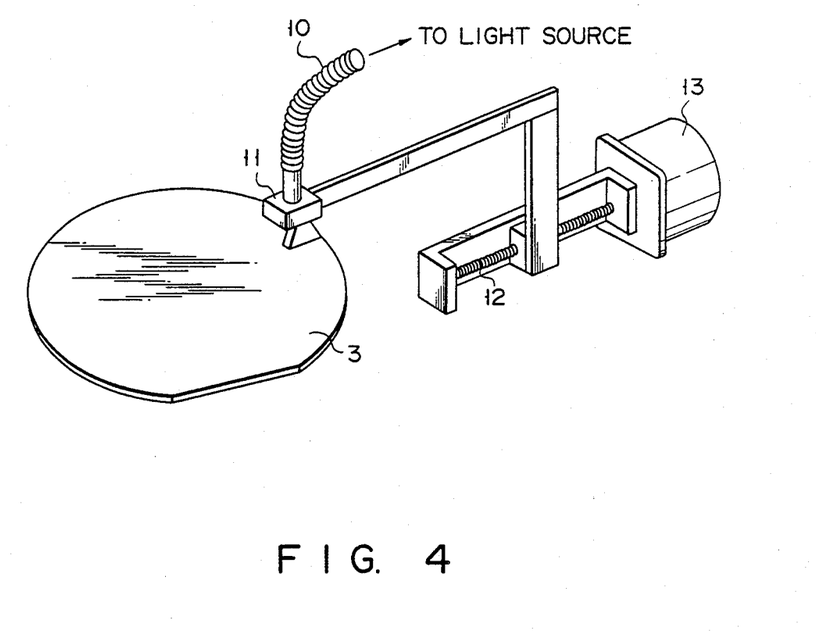
FIG. 4 is a view illustrating a light source movable mechanism of the apparatus in FIG. 1 as a modification.

In the above embodiment, movable mechanism 12 employs the ball screw. However, the present invention is not limited to this as long as light radiating element 11 can be moved to a desired position. Therefore, a mechanism using a timing belt or a linear motor may be employed. In addition, in order to improve cleanliness of the apparatus, movable mechanism 12 may be arranged below semiconductor wafer 3, as shown in FIG. 4.

In the embodiment, the CCD image sensor serving as a solid-state imaging element is used as photosensor 7. However, the present invention is not limited to the above embodiment. Any sensor can be employed a long as it can detect a peripheral portion of semiconductor wafer 3 in a noncontact state.

Although in the embodiment, only the upper surface treatment of semiconductor wafer 3 is exemplified, a lower surface can be treated in the same manner as described above as long as a peripheral portion is treated.

In the embodiment, semiconductor wafer 3 is used as the substrate to be processed. However, any film-coated substrate can be processed, and hence a rectangular glass substrate such as a substrate for a liquid crystal display unit can be processed.

In the embodiment, peripheral exposure is performed while rotary axis of semiconductor wafer 3 is fixed. However, the position of the rotary axis of semiconductor wafer 3 may be adjusted in accordance with data of a peripheral portion. In other words, any means can be employed as long as it can adjust the position of semiconductor wafer 3 relative to light radiating element 11.

As has been described above, according to the embodiment, semiconductor wafer 3 is mounted on mounting table 2. Then, while mounting table 2 is rotated, a peripheral portion of semiconductor wafer 3 is detected by photosensor 7 and control section 14 calculates a desired exposure portion. Exposure is performed while the position of an exposure light source is moved/controlled relative to semiconductor wafer 3. As a result, a resist and the like on semiconductor wafer 3 can be removed such that the resist and the like on only a desired portion including an orientation flat are removed. In addition, the resist projection on a boundary portion formed upon removal of the resist and the like, and hence defocus can be prevented.

What is claimed is:

1. An exposure apparatus comprising:
    a mounting table on which a substrate to be processed is mounted;
    a rotating mechanism for rotating said mounting table at a predetermined rotational speed;
    a light radiating element arranged to oppose a mounting surface of said mounting table;
    light amount control means for controlling an amount of light radiated from said light radiating element onto the substrate;
    a movable mechanism for reciprocating said light radiating element along an imaginary straight line extending through a center of the mounting surface; and
    rotational speed control means for controlling a rotational speed of said mounting table in accordance with a radiation amount of light from said light radiating element.

2. An apparatus according to claim 1, wherein said movable mechanism is operated in response to a signal from end face detecting means for detecting a peripheral end of the substrate.

3. An apparatus according to claim 3, wherein said end face detecting means comprises a photosensor.

4. An apparatus according to claim 3, wherein said photosensor is a solid-state imaging element.

* * * * *